US007326358B2

(12) United States Patent
Sugimoto (10) Patent No.: US 7,326,358 B2
(45) Date of Patent: Feb. 5, 2008

(54) PLASMA PROCESSING METHOD AND APPARATUS, AND STORAGE MEDIUM

(75) Inventor: Masaru Sugimoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/235,341

(22) Filed: Sep. 27, 2005

(65) Prior Publication Data

US 2006/0065630 A1    Mar. 30, 2006

Related U.S. Application Data

(60) Provisional application No. 60/620,349, filed on Oct. 21, 2004.

(30) Foreign Application Priority Data

Sep. 27, 2004  (JP) .............................. 2004-279432

(51) Int. Cl.
    C23F 1/00    (2006.01)

(52) U.S. Cl. .......................... 216/67; 216/51; 216/72; 216/79; 438/610; 438/706; 438/714; 438/724; 438/743; 438/744

(58) Field of Classification Search ................. 216/67; 438/706
    See application file for complete search history.

(56) References Cited

U.S. PATENT DOCUMENTS

| 5,681,424 | A | * | 10/1997 | Saito et al. ................. 438/716 |
| 5,772,833 | A | * | 6/1998 | Inazawa et al. ......... 156/345.47 |
| 6,967,171 | B2 | * | 11/2005 | Fujimoto et al. ............ 438/714 |

OTHER PUBLICATIONS

Y. Ma, Journal of Vacuum Science & Technology, vol. B 13(4), Jul./Aug. (1995)., pp. 1460-1465.

* cited by examiner

*Primary Examiner*—Nadine G. Norton
*Assistant Examiner*—Maki Angadi
(74) *Attorney, Agent, or Firm*—Oblon, Spivak, McClelland, Maier & Neustadt, P.C.

(57) ABSTRACT

A plasma processing method performs a plasma processing on a substrate mounted on a mounting table installed in an airtight processing chamber, the mounting table having a smaller size than the substrate. The substrate having a surface, on which a resist mark is formed, is mounted on the mounting table and then electrostatically adsorbed on the mounting table by applying a voltage to an electrostatic chuck. The surface of the substrate is etched by using a plasma of an etching gas while the substrate is cooled through a heat transfer between the substrate and the mounting table via a thermally conductive gas supplied between a top surface of the mounting table and a bottom surface of the substrate. The supply of the thermally conductive gas is stopped, and the resist mask on the substrate is ashed by using a plasma of an ashing gas containing $O_2$.

8 Claims, 6 Drawing Sheets

(45°) SECTION E
(30°) SECTION D (1.0mm) SECTION C  (0.5mm) SECTION B  (0.0mm) SECTION A

|  | SECTION C | SECTION B | SECTION A | SECTION D | SECTION E |
|---|---|---|---|---|---|
|  | 1.0mm | 0.5mm | 0.0mm | SLANT 30° | SLANT 45° |
| ASHING 15sec | 0.0 | 7.5 | 18.0 | 6.5 | 0.0 |
| ASHING 20sec | 0.0 | 0.0 | 0.0 | 0.0 | 0.0 |

FIG.5B

|  | SECTION C | SECTION B | SECTION A | SECTION D | SECTION E |
|---|---|---|---|---|---|
|  | 1.0mm | 0.5mm | 0.0mm | SLANT 30° | SLANT 45° |
| ASHING 25sec | 0.0 | 11.0 | 11.0 | 1.0 | 0.0 |
| ASHING 35sec | 0.0 | 0.0 | 0.0 | 0.0 | 0.0 |

FIG.5C

|  | SECTION C | SECTION B | SECTION A | SECTION D | SECTION E |
|---|---|---|---|---|---|
|  | 1.0mm | 0.5mm | 0.0mm | SLANT 30° | SLANT 45° |
| ASHING 25sec | 2.0 | 4.0 | 12.5 | 13.0 | 0.0 |
| ASHING 35sec | 0.0 | 0.0 | 11.0 | 6.8 | 0.0 |
| ASHING 45sec | 0.0 | 5.0 | 6.5 | 6.5 | 0.0 |
| ASHING 60sec | 0.0 | 0.0 | 0.0 | 0.0 | 0.0 |

FIG.5D

|  | SECTION C | SECTION B | SECTION A | SECTION D | SECTION E |
|---|---|---|---|---|---|
|  | 1.0mm | 0.5mm | 0.0mm | SLANT 30° | SLANT 45° |
| NO ASHING | 7.5 | 27.5 | 69.0 | 71.5 | 32.8 |

PLASMA PROCESSING METHOD AND APPARATUS, AND STORAGE MEDIUM

FIELD OF THE INVENTION

The present invention relates to a plasma processing method and apparatus for performing an etching process by using a plasma of an etching gas and an ashing process by using a plasma of an ashing gas, and a storage medium.

BACKGROUND OF THE INVENTION

In a semiconductor device manufacturing process, in order to separate a capacitor or a device or to form a contact hole, a dry etching is performed on a substrate, e.g., a semiconductor wafer (hereinafter, referred to as "wafer"), on which a resist mask is formed, and, then, an ashing process is carried out to remove the resist remaining on the surface after the etching process. As one of methods for performing such processes, there has been known a plasma processing method employed in a single sheet parallel plate type plasma processing apparatus.

Figure 6:
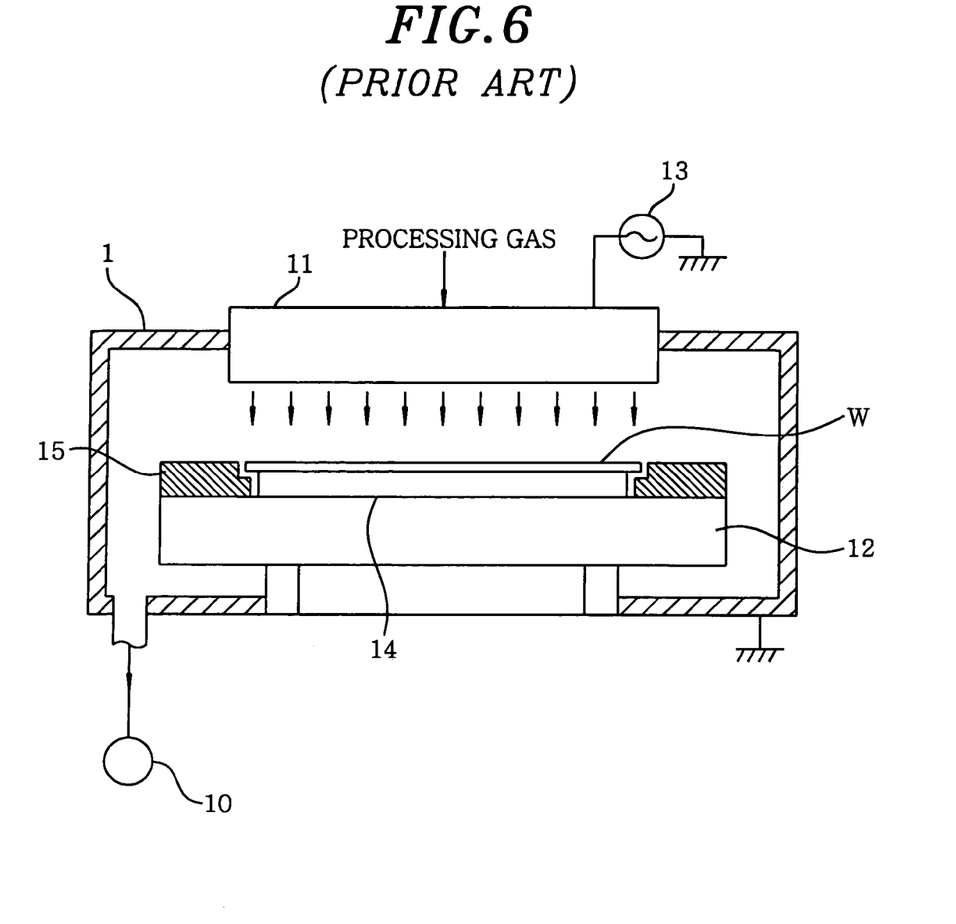
FIG. 6 presents an explanatory diagram of a conventional plasma processing apparatus.

Hereinafter, a schematic constitution of such plasma processing apparatus will be briefly described with reference to FIG. 6. In such a plasma processing apparatus, an upper electrode 11 serving as a gas shower head and a mounting table 12 serving as a lower electrode and also as a cooling plate are installed at an upper and a lower portion in a processing chamber 10 having a vacuum exhaust unit 10, respectively, and a high frequency power supply 13 for forming a high frequency electric field between the electrodes is connected to the upper electrode 11. Further, a wafer mounting region on an electrostatic chuck 14 installed on top of the mounting table 12 is formed smaller than a size of a wafer W. A ring member 15, e.g., a quartz ring, is installed so as to surround an entire circumference of the electrostatic chuck 14. The ring member 15 is disposed to face a side peripheral surface and a bottom peripheral portion of the wafer W protruded outwardly from the mounting region with a gap formed therebetween. Moreover, formed on a surface of the electrostatic chuck 14 are gas supply openings (not shown) for supplying a thermally conductive He gas to be outwardly diffused from a central portion through gaps formed by slight irregularities on surfaces of the wafer W and the electrostatic chuck 14.

Mounted on the mounting table 12 is the wafer W on which an insulating film made of, e.g., $SiO_2$ and a resist mask of a circuit pattern are laminated. Further, a chuck voltage is applied to the electrostatic chuck 14 and an inner space of the processing chamber 1 is vacuum-exhausted by a vacuum exhaust unit 10. In such state, an etching gas containing a compound of C and F (e.g., CxFy) is plasmarized, thereby etching the insulating film. Next, a supply of the etching gas is stopped and an ashing gas containing $O_2$ is then supplied into the processing chamber 1. The ashing gas is plasmarized by forming a high frequency electric field, so that the resist exposed to the plasma is ashed and removed. Accordingly, after having undergone such processes, the insulating film on the wafer W has therein grooves corresponding to the circuit pattern.

Figure 7:
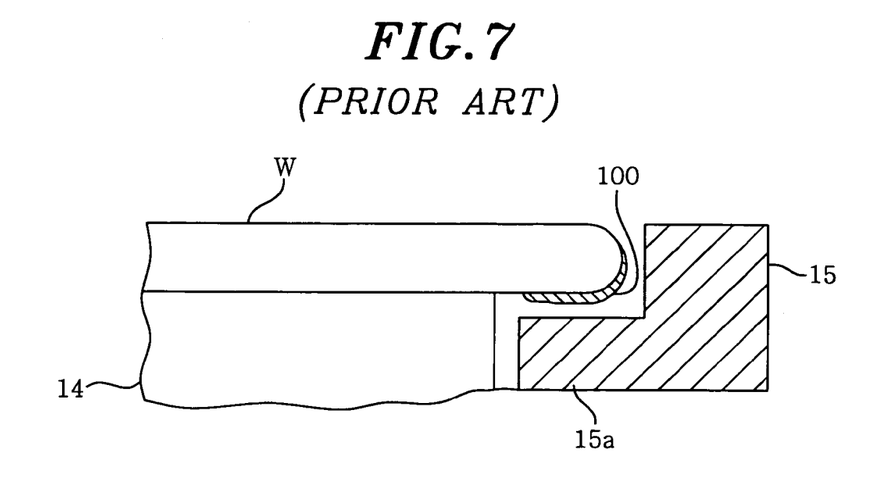
FIG. 7 depicts an explanatory diagram describing a status of a peripheral portion of a plasma-processed wafer.

However, if the etching process is performed by using a plasma of a CF-based gas, as schematically illustrated in FIG. 7, a polymer mainly composed of CFx, which is generated by a decomposition or a reaction of the etching gas, is adhered to the bottom peripheral portion and the side edge surface of the wafer W. In other words, the mounting table 12 is formed in a smaller size than the wafer W to prevent damages inflicted by the etching gas. Further, in general, the ring member 15, referred to as, e.g., a focus ring, for adjusting a plasma shape is installed so as to surround the wafer W. In order to prevent the gas from flowing toward the bottom surface of the wafer W, a stepped portion 15a is formed at an inner side of the ring member 15 such that it extends into a space under the bottom surface of the wafer W. However, it is not sufficient to prevent the plasma from flowing into the space, so that deposits of the polymer are adhered to the bottom peripheral portion of the wafer W.

In the ashing process after the etching process, the plasma of the ashing gas containing $O_2$ flows into the aforementioned space along a slight gap between the peripheral portion of the wafer W and the ring member 15. Accordingly, the deposits adhered to the bottom peripheral portion and the side edge portion of the wafer W become ashed. However, a considerable time period is required to completely remove the deposits and, in some cases, the deposits are not completely removed.

Meanwhile, if the deposits are adhered to the bottom peripheral portion (and the side edge portion) of the wafer W, they are separated therefrom in a post-process to be a cause of particles. Further, in a chemical polishing process as the post-process, portions to which the deposits are adhered are stressed, thereby deteriorating polishing accuracy. Accordingly, the wafer W that has gone through the ashing process is subjected to a cleaning process using cleaning fluid in a cleaning vessel. In this case, the deposits detached from the wafer W may be introduced into the cleaning vessel and transcribed on another wafer, so that an exchange cycle of the cleaning fluid in the cleaning vessel needs to be frequently performed. In order to sufficiently remove the deposits during the ashing process after the etching process, it is considered to extend the ashing time to allow the plasma to reach the bottom peripheral portion of the wafer W. In this case, however, depending on types of the insulating film, the film may be changed in quality.

As for an interlayer insulating film, for example, a SiOC film, i.e., a compound of silicon, oxygen and carbon, is widely used due to its low dielectric constant. However, if the film is exposed to an oxygen plasma for a long time, a surface thereof becomes oxidized, thereby changing SiOC to $SiO_2$. The $SiO_2$ is removed in a post-cleaning process, resulting in a wider line width. Further, the increase in the ashing time deteriorates a throughput thereof.

A conventional sequence of the plasma processing includes the steps of: stopping a supply of a thermally conductive gas after a specific processing is performed by using a plasma; stopping an application of a chuck voltage to the electrostatic chuck; and stopping a supply of a power for generating the plasma (see, e.g., Japanese Patent Laid-open Publication Nos. H4-290225 and H8-153713). However, there is not disclosed nor suggested any process after the processing described above.

SUMMARY OF THE INVENTION

It is, therefore, an object of the present invention to provide a plasma processing method and apparatus, wherein when ashing process is performed by using a plasmarized gas containing $O_2$ after an etching process has been performed on a substrate by using a plasma, deposits adhered to the substrate during the etching process can be sufficiently removed in a short time period.

In accordance with one aspect of the invention, there is provided a plasma processing method for performing a plasma processing on a substrate mounted on a mounting table installed in an airtight processing chamber, the mounting table having a smaller size than the substrate, the method including the steps of: mounting the substrate having a surface, on which a resist mask is formed, on the mounting table and then electrostatically adsorbing the substrate on the mounting table by applying a voltage to an electrostatic chuck; etching the surface of the substrate by using a plasma of an etching gas while cooling the substrate by way of transferring a heat of the substrate to the mounting table through a thermally conductive gas supplied between a top surface of the mounting table and a bottom surface of the substrate; stopping the supply of the thermally conductive gas; and ashing the resist mask on the substrate by using a plasma of an ashing gas containing $O_2$.

The present invention preferably includes a step of stopping the voltage application to the electrostatic chuck after stopping the supply of the thermally conductive gas, wherein the ashing process is performed on the substrate under such conditions. This is because if the application of the voltage to the electrostatic chuck is stopped in advance, the substrate is lifted up by the thermally conductive gas. Even though the supply of the thermally conductive gas and the voltage application to the electrostatic chuck are stopped simultaneously, this is also considered to be included in the descriptions "the voltage application to the electrostatic chuck is stopped after the supply of the thermally conductive gas is stopped" of the present invention if the substrate is not lifted up. In this case, the etching gas is a compound of carbon and fluorine, for example. Further, a film to be etched is a film containing $O_2$, e.g., a silicon oxide film, an SiOC film or the like.

In accordance with another aspect of the invention, there is provided a plasma processing apparatus including: a mounting table having a cooling function, the mounting table being installed in a processing chamber and having a smaller size than a substrate; an electrostatic chuck installed on the mounting table, for electrostatically adsorbing the substrate; a power supply unit for applying a voltage to the electrostatic chuck; a thermally conductive gas supply unit for supplying a thermally conductive gas between a top surface of the mounting table and a bottom surface of the substrate, wherein after the substrate having thereon a resist mask is mounted on the mounting table and then electrostatically adsorbed by the electrostatic chuck, an etching process is performed on a surface of the substrate by using a plasma while the thermally conductive gas is supplied; and a control unit having a program including an instruction for stopping the thermally conductive gas supply of the thermally conductive gas supply unit after the etching process is completed, and an instruction for ashing the resist on the substrate by using a plasma of an ashing gas containing $O_2$.

Preferably, the program further includes an instruction for turning off the power supply unit to stop the voltage application to the electrostatic chuck after the supply of the thermally conductive gas is stopped and before the resist mark is ashed.

In accordance with still another aspect of the invention, there is provided a storage medium for storing therein the program.

In accordance with the present invention, the ashing process after the etching process is performed while stopping the supply of the thermally conductive gas to the bottom surface of the substrate. The thermally conductive gas is used for transferring the heat of the substrate received from the plasma to the mounting table during a plasma processing. Thus, if the supply of the thermally conductive gas is stopped, the heat transferred from the substrate to the mounting table is reduced. Accordingly, the ashing process is performed under a high temperature of the substrate, thereby improving the deposit removal efficiency. Moreover, by stopping the supply of the thermally conductive gas, the plasma can easily flow through the gap between the substrate and the focus ring into the bottom side of the substrate. Therefore, the deposits can be sufficiently removed by the ashing process in a short time. As a result, an introduction of particles into a cleaning vessel is suppressed and the ashing time is shortened, thereby enabling to reduce defects on the film of the substrate. Besides, if the voltage application to the electrostatic chuck is stopped during the ashing process, the gap between the substrate and the mounting table is increased. Accordingly, the heat transfer efficiency from the substrate to the mounting table deteriorates, so that a temperature of the substrate increases. As a result, the deposit removal efficiency is further enhanced.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Figure 1:
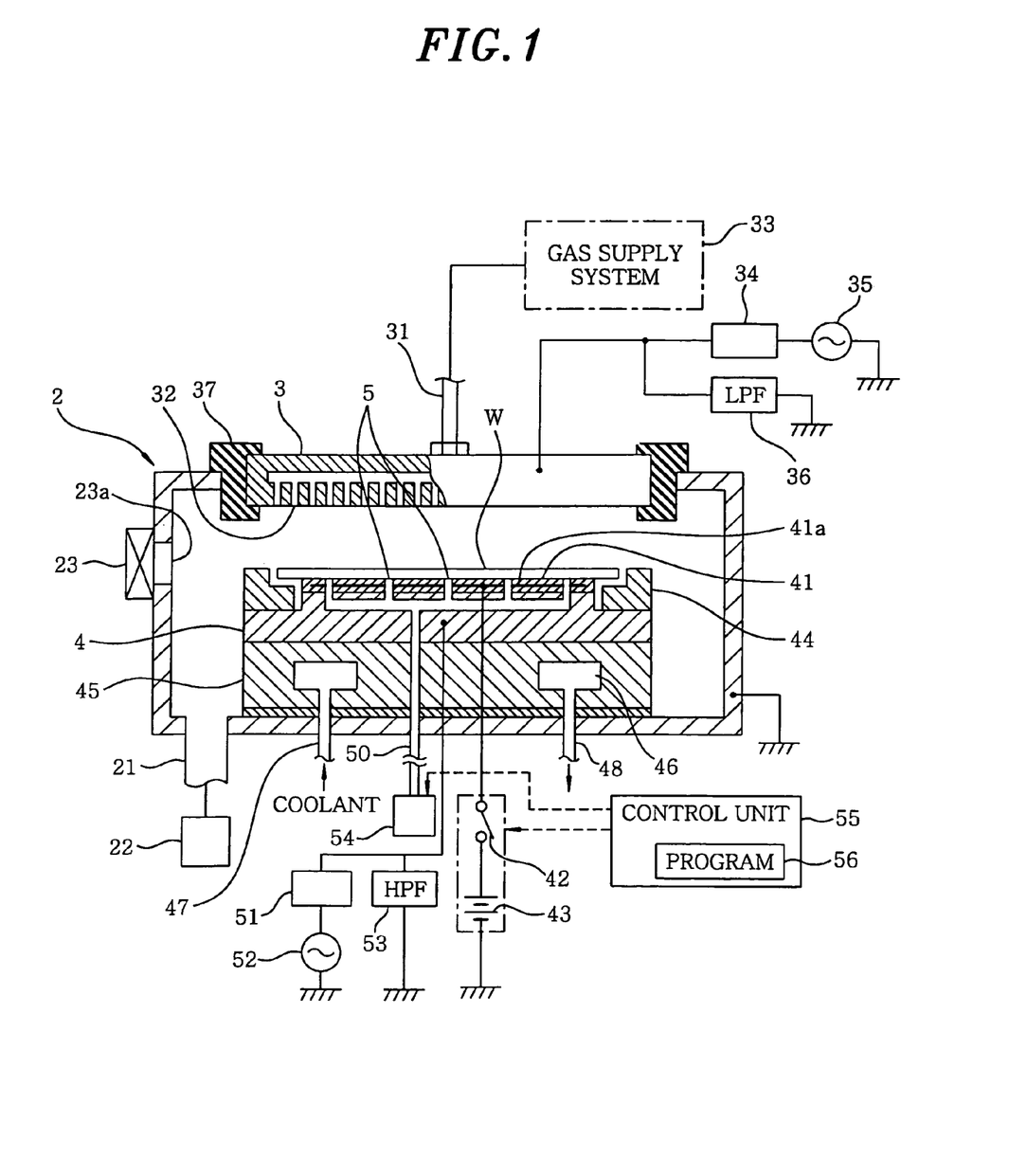
FIG. 1 shows a vertical sectional view of a plasma processing apparatus in accordance with a preferred embodiment of the present invention.
Figure 2:
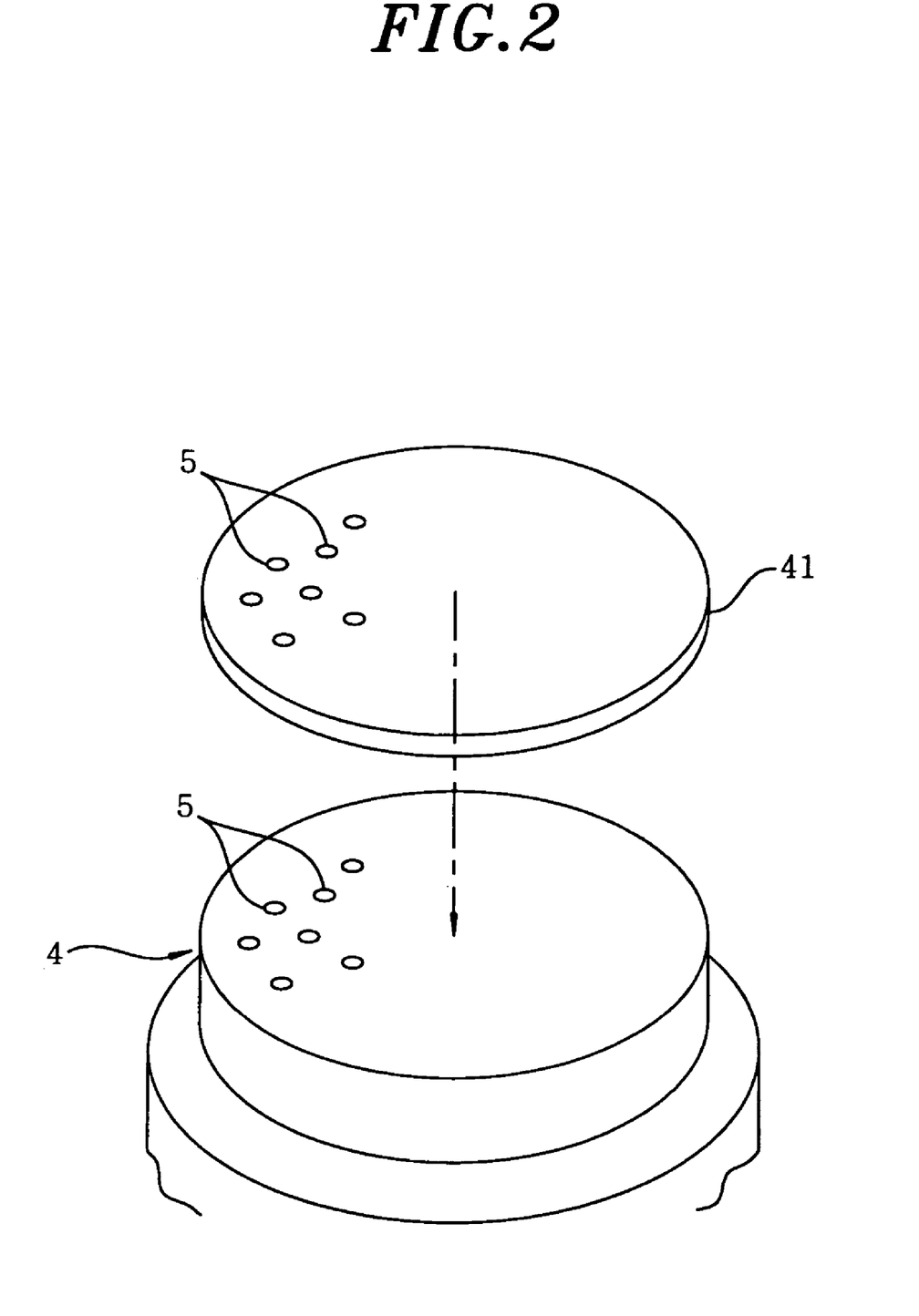
FIG. 2 describes an explanatory diagram of a mounting table of the plasma processing apparatus.

A preferred embodiment of a semiconductor manufacturing apparatus of the present invention will be described with reference to FIGS. 1 and 2. Reference numeral 2 indicates an airtight processing chamber made of a conductive material, e.g., aluminum or the like, wherein the processing chamber 2 is grounded. Further, an upper electrode 3 serving as a gas shower head, i.e., a gas supply unit for introducing a specific gas, and a mounting table 4 serving as a lower electrode for mounting thereon a substrate, e.g., a wafer W, are disposed to face each other in the processing chamber 2.

The mounting table 4 is formed to have a smaller size than the wafer W such that a mounting region of the mounting table 4, on which the wafer W is mounted, is set to be smaller than a size of the corresponding wafer W. Therefore, a peripheral portion of the wafer W mounted on the mounting table 4 is outwardly protruded by, e.g., 1.7 mm to 2.0 mm. Further, a gas exhaust line 21 is connected to a bottom portion of the processing chamber 2, and a vacuum exhaust unit, e.g., a vacuum pump 22 such as a turbo molecular pump, a dry pump or the like, is connected to the gas exhaust line 21. Furthermore, an opening 23a for loading/unloading the wafer W is provided in a sidewall of the processing chamber 2, wherein the opening 23*a* has an openable/closable gate valve 23.

A plurality of gas diffusion holes 32 communicating with a gas supply line 31, e.g., a piping, are formed in a bottom surface of the upper electrode 3, so that an etching gas or an ashing gas as a specific processing gas can be sprayed therethrough toward the wafer W mounted on the mounting table 4. The distal end of the gas supply line 31 is connected to a gas supply system 33. Specifically, the gas supply system 33 includes an etching gas supply system and an ashing gas supply system, each having a controller, e.g., a valve, a mass flow control unit or the like, and a gas supply source (not shown). Further, by switching flow paths with the help of a flow path switching unit, either the CF-based etching gas or the ashing gas containing $O_2$ can be supplied at a specific flow rate via the gas supply line 31.

Connected to the upper electrode 3 is a high frequency power supply unit 35 for supplying a high frequency power via a matching unit 34 and a low pass filter 36. Moreover, an annular shield ring 37 is installed to surround the upper electrode 3 while being engaged with a peripheral portion of the upper electrode 3.

The mounting table 4 is made of a conductive material, e.g., aluminum or the like, and has an electrostatic chuck 41 installed on a surface thereof. A thin electrode 41*a*, for example, is provided inside the electrostatic chuck 41, and a DC power supply 43 is connected to the electrode 41*a* via a switch 42. By applying a DV voltage (chuck voltage) to the electrode 41*a*, the wafer W can be electrostatically adsorbed on a surface of the electrostatic chuck 41 by an electrostatic force. In this example, the switch 42 and the DC power supply 43 serve as a power supply unit for applying a voltage to the electrostatic chuck 41.

Further, a focus ring 44 made of, e.g., quartz is installed around the electrostatic chuck 41 so as to surround a periphery of the wafer W adsorptively held on the electrostatic chuck 41. Specifically, as described above, the peripheral portion of the wafer W mounted on the mounting table 4 is outwardly protruded therefrom, and an inner peripheral surface of the focus ring 44 has a stepped portion which faces a bottom surface and a side peripheral surface of such protruded portion with a slight gap of 1 mm or more formed therebetween.

Provided at a lower portion of the mounting table 4 is a supporting body 45 made of, e.g., aluminum or the like. A temperature control fluid path 46 of a cooling unit provided in the supporting body 45, and a coolant as a cooling medium flows therethrough. In other words, the top surface of the mounting table 4 serves as a cooling plate for cooling the wafer W to a predetermined temperature of, e.g., 20° C., by way of taking heat from the wafer W whose temperature otherwise increases by a plasma reaction. Reference numerals 47 and 48 indicate a coolant inlet path and a coolant outlet path, respectively. Moreover, although the mounting table 4 and the supporting body 45 are given different reference numerals for convenience, the supporting body 45 is a part of the mounting table for mounting thereon the wafer W.

Microscopically, the surface of the electrostatic chuck 41 or that of the wafer W mounted on the electrostatic chuck 41 has irregularities due to limitations of a manufacturing precision. Accordingly, even though the wafer is electrostatically adsorbed, a gap is formed between the electrostatic chuck 41 and the wafer W due to the irregularities and, under a vacuum atmosphere, a heat transfer efficiency through the gap becomes considerably poor. To that end, a plurality of injection openings 5, a part of a thermally conductive gas supply unit is formed in the surface of the electrostatic chuck 41 (see FIG. 2), so that a thermally conductive gas, e.g., He gas, for enhancing the heat transfer efficiency through the gap formed between the mounting table 4 and the wafer W can be injected through the injection openings 5 toward the bottom surface of the wafer W and diffused from a central portion outwardly. The injection openings 5 communicate with a thermally conductive gas supply line 50 penetrating the mounting table 4, the supporting body 45 and the electrostatic chuck 41. A thermally conductive gas supply unit 54 is connected to the thermally conductive gas supply line 50 and includes a gas supply source, a valve, a mass flow control unit and the like.

Connected to the mounting table 4 are a high frequency power supply 52 for applying a bias power via a matching unit 51 and a high pass filter 53. Further, installed inside the mounting table 4 and the supporting body 45 are elevating pins (not shown) capable of transferring the wafer W from/to a transfer arm (not shown).

The plasma processing apparatus has a control unit 55 for controlling a pressure control unit (not shown) provided at the gas exhaust line 21, the gate valve 23, the high frequency power supply units 35 and 52, the switch 42, the gas supply system 33, the thermally conductive gas supply unit 54 and the like. Therefore, while reading a specific process recipe, the control unit 55 executes a process corresponding to the recipe based on a sequential program 56 stored in a memory as a storage medium. In such program 56, various instructions are recorded such that operations to be described later can be carried out. Further, the program in the control unit 55 is installed from the storage medium such as a compact disk, a flexible disk, a memory stick, a magneto optical disk (MO) or the like. Moreover, the storage medium of the present invention includes a hard disk, a ROM or the like provided in a computer, for storing installed programs and developing them in the memory when necessary.

Figure 3:
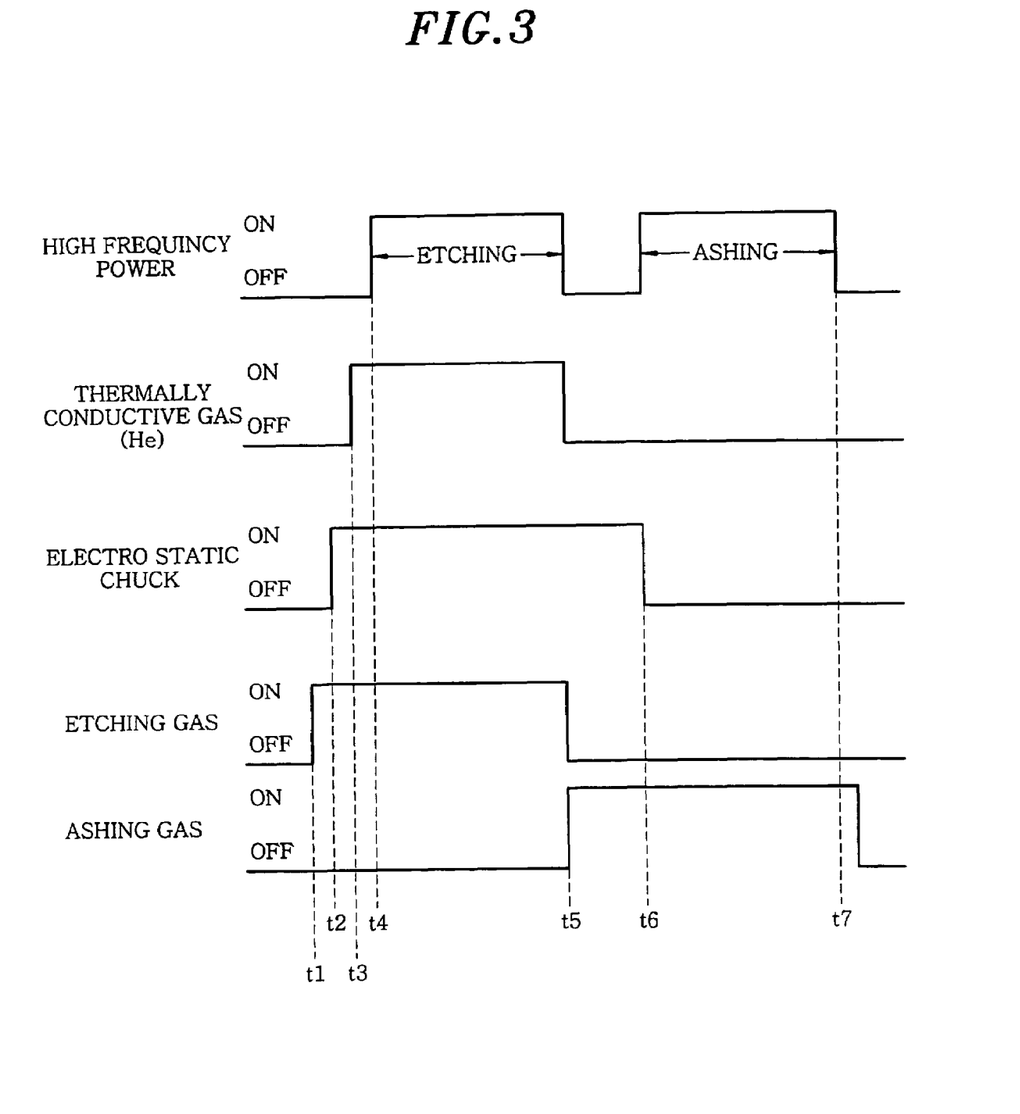
FIG. 3 provides a flow chart illustrating a wafer processing process of the plasma processing apparatus.

Hereinafter, there will be described of a sequence of a plasma processing on a surface of a substrate, e.g., a wafer W, by using the aforementioned plasma processing apparatus. First of all, the gate valve 23 is opened and, then, the wafer W as the substrate is loaded from a load-lock camber (not shown) into the processing chamber 2. Next, the wafer W is mounted on the top surface of the mounting table 4 and, at the same time, the gate valve 23 is closed. Thereafter, as illustrated in FIG. 3, at a time t1, a CF-based gas, e.g., $C_4F_8$ gas, as an etching gas and Ar gas as an inert gas are supplied at respective specific flow rates from the gas shower head as the upper electrode 3 into the processing chamber 2. At this time, the etching gas supplied into the processing chamber 2 flows along the surface of the wafer W diametrically outwardly and is then exhausted through a periphery of the mounting table 4.

Next, at a time t2, a power supply unit for the electrostatic chuck 41 is turned on, i.e., the switch 42 is closed. Then, by applying a chuck voltage to the electrostatic chuck 41, the wafer W is electrostatically adsorbed. Thereafter, at a time t3, a valve of the thermally conductive gas supply unit 4 is opened, and a thermally conductive gas, e.g., He gas, is supplied to the bottom surface of the wafer W. Accordingly, the thermally conductive gas flows in and along a slight gap between the bottom surface of the wafer W and the top surface of the mounting table 4.

Subsequently, at a time t4, the high frequency power supply units 35 and 52 are turned on, so that a high frequency voltage is applied between the upper electrode 3 and the lower electrode 4 as the mounting table, thereby plasmarizing the etching gas. Further, since a bias power is applied by the high frequency power supply unit 52, active species of the plasma impact on the wafer W with high verticality. Accordingly, a SiOC film on the wafer W, for example, is etched by such plasma. At this time, the plasma flows through the gap between the wafer W and the ring member 44 toward the bottom side of the wafer W and, thus, a polymer that is a decomposition product or a reaction product of $C_4F_8$ gas, is adhered as deposits to the bottom surface and the side edge portion of the wafer W.

Although heat is transferred from the plasma to the wafer W, since the mounting table 4 is cooled and the thermally conductive gas is interposed between the wafer W and the mounting table 4, the heat transferred to the wafer W is discharged to the mounting table 4 via the thermally conductive gas. With such heat balance, the temperature of the wafer W can be maintained within a predetermined range from about 10° C. to about 40° C. After the etching process is carried out for a specific time period, at a time t5, the application of the high frequency power is stopped by turning off the high frequency power supply units 35 and 52 and at the same time the supply of the etching gas is stopped, thereby stopping the etching process. Further, the supply of the thermally conductive gas is stopped slightly later and, at the same time, an ashing gas containing $O_2$, e.g., $O_2$ gas, is supplied from the gas supply system 3 into the processing chamber 2 via the shower head (upper electrode) 3.

Thereafter, at a time t6, the ashing gas is plasmarized by turning on the high frequency power supply units 35 and 52 and, at the same time, a power supply unit of the electrostatic chuck 41 is turned off (the switch 42 is turned off). At this time, since the supply of the thermally conductive gas is stopped, the gap between the mounting table 4 (the electrostatic chuck 41) and the wafer W is under a high vacuum level. Further, since the wafer W is released from the electrostatically adsorbed state, the gap is increased. As a result, the thermal conductivity between the wafer W and the mounting table 4 deteriorates, so that the ashing process can be performed while maintaining a temperature of the wafer W within a range of, e.g., 60° C. to 78° C., by the heat of the plasma.

A resist on the surface of the wafer W is ashed and removed by the active species of oxygen generated when $O_2$ gas is plasmarized. However, the deposits adhered to the bottom surface of the wafer W during the etching process are removed by the plasma flowing through the gap between the wafer W and the ring member 44 toward the bottom surface of the wafer W. At this time, the thermally conductive gas is not sprayed toward the bottom surface of the wafer W and the gap between the wafer W and the mounting table 4 increases, so that the plasma is apt to flow through the gap toward the bottom surface of the wafer W. Further, due to a high temperature of the wafer W, the reaction between the deposits and the plasma is accelerated, so that the deposits can be readily removed. Moreover, it is preferable to stop the application of the chuck voltage after the supply of the thermally conductive gas is stopped or at the substantially same time when the supply thereof is stopped. Accordingly, the wafer W released from the electrostatically adsorbed state can be prevented from being blown away by an injection pressure of the thermally conductive gas. Next, at a time t7, the plasma generation is stopped by turning off the high frequency power supply units 35 and 52 and, then, an introduction of the ashing gas is stopped slightly later. Subsequently, the wafer W is unloaded after opening the gate valve 23. Such series of processes are carried out based on the program stored in the memory in the control unit 55.

In accordance with the aforementioned embodiment, the wafer W is exposed to a plasma of an oxygen-containing eshing gas under the condition that the supply of the thermally conductive gas to the bottom surface of the wafer W is stopped, thereby removing the deposits adhered to the surface of the wafer W during the etching process. Accordingly, as described above, the plasma can easily flow into the gap between the wafer W and the focus ring 44 and the temperature of the wafer W increases due to the stop of the supply of the thermally conductive gas, so that the removal of the deposits can be facilitated. Accordingly, the deposits can be sufficiently removed during a short-time ashing process. As a result, even though the deposits are adhered to the bottom surface of the plasma-processed wafer W, the amount of deposits is reduced compared with a conventional case, which in turn decreases the amount of foreign materials to be introduced into the cleaning vessel in a subsequent cleaning process. Thus, the exchange cycle of the cleaning fluid is extended.

Further, in accordance with the aforementioned embodiment, since the ashing process is carried out under the condition that the wafer W is released from the electrostatically adsorbed state (i.e., the voltage application to the electrostatic chuck 41 is stopped), the wafer W, which was slightly transformed in the electrostatically adsorbed state to reduce the gap formed between the wafer W and the electrostatic chuck 41 due to their surface irregularities, is restored to the original state. Accordingly, the gap between the wafer W and the electrostatic chuck 41 is increased. The heat transfer efficiency between the wafer W and the mounting table 4 deteriorates due to the increased gap, so that the temperature of the wafer W increases. Moreover, since the oxygen plasma is apt to flow through the increased gap toward the bottom side of the wafer W, it is possible to facilitate the removal of the deposits adhered to the bottom surface (and the side edge portion) of the wafer W. For the purpose of increasing the temperature of the wafer W in the ashing process, it may be considered to provide a heater in the mounting table 4. In that case, however, a subsequent etching process may be affected by the temperature variation of the mounting table 4 from a preset temperature. In contrast, the method of this embodiment is advantageous in that a subsequent etching process is not affected since the temperature of the mounting table 4 is maintained.

In the above-described preferred embodiment of the present invention, the supply of the thermally conductive gas and the application of the chuck voltage are both stopped. However, the present invention is not limited thereto, and only the supply of the thermally conductive gas may be stopped, which also exhibits the substantially same effects as those in the aforementioned case. On the other hand, only the application of the chuck voltage may be stopped. In this case, in order to prevent the wafer W from blowing away due to an injection pressure of the thermally conductive gas, it is required to stop the application of the chuck voltage after reducing a flow rate of the thermally conductive gas. In the present invention, since the flow rate reduction of the thermally conductive gas is substantially same as the stop of the thermally conductive gas supply and has no particular advantage, it can be considered to be included in the conception of the stop of the thermally conductive gas supply and also in the technical scope of the invention defined in the claims to be described later.

In the present invention, an etching gas as a compound of carbon and fluorine may be $C_5F_8$ or the like. Further, a film containing $O_2$ as an etching target can be an $SiO_2$ film or the like.

EXPERIMENTAL EXAMPLES

Hereinafter, there will be described experimental examples conducted to confirm the effects of the present invention.

Experimental Example 1

Figure 4:
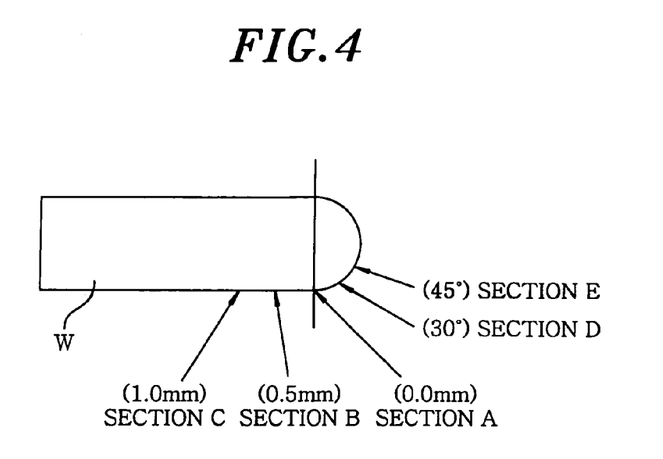
FIG. 4 represents an explanatory diagram depicting measured portions of deposits in experiments conducted to confirm effects of the present invention.
Figure 5A:
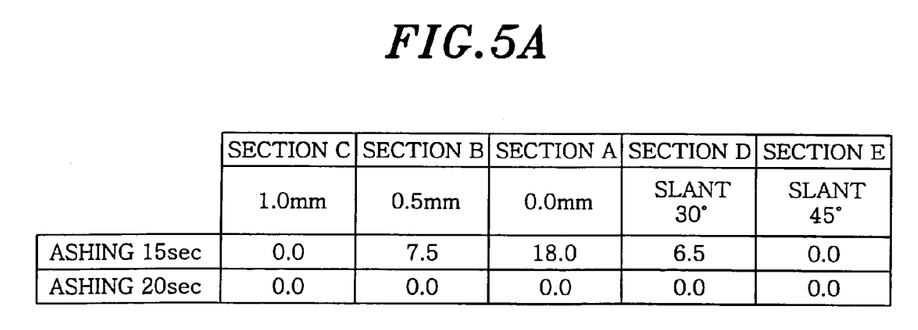
FIGS. 5A to 5D offer a characteristic diagrams showing results of the above experiments.

This example is an experimental example in which an etching process and an ashing process were performed on the wafer W based on the aforementioned embodiment. While a bias power was applied, an ashing (wafer ashing) time was set to be 15 seconds and 20 seconds. Other detailed processing conditions will be described below. It was checked whether or not deposits are adhered to the portions illustrated in FIG. 4 of the processed wafer and, then, if the deposits were adhered, thickness thereof was measured. Brief descriptions on the measured portions will be described as follows. An outer edge of a flat surface of the wafer W is represented by SECTION A (0.0 mm); a portion located 0.5 mm inward from the SECTION A, SECTION B (0.5 mm); a portion located 1.0 mm inward from the SECTION A, SECTION C (1.0 mm); a portion located on a curved side peripheral surface angularly away by 30° from the SECTION A, SECTION D (30°); and a portion located on the curved side peripheral surface angularly away by 45° from the SECTION A, SECTION E (45°). The measured results for such portions are shown in FIG. 5A.

Wafer W: 8 inch (etching target: SiOC film)
Etching gas: $C_4F_8$ gas+Ar gas
Etching time: 160~170 seconds
Ashing gas: $O_2$ gas (1000 sccm)
Ashing pressure: 800 mTorr
High frequency power in ashing process: 1000 W
Bias power in ashing process: 300 W
Processing vessel cleaning ashing time (while a bias voltage apply is stopped): 25 seconds
Wafer ashing time (while a bias voltage is applied): 15 seconds, 20 seconds

Experimental Example 2

Figure 5B:
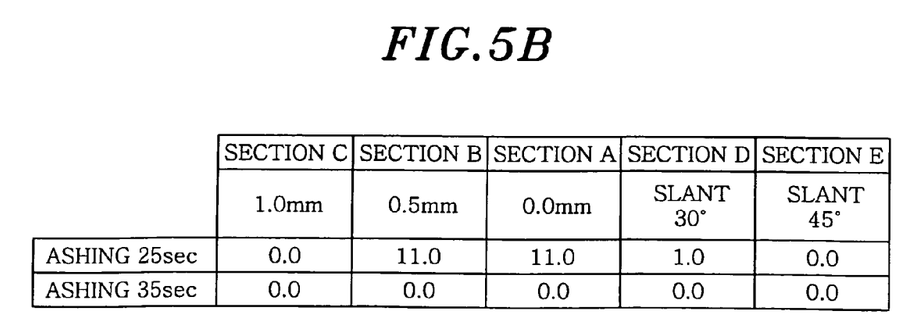

This example is an experimental example where the processing was performed under the same conditions as those in Experimental example 1 except that the application of the chuck voltage was not stopped and that the wafer ashing time was set to be 25 seconds and 35 seconds. The measured results of the deposits are illustrated in FIG. 5B.

Comparative Example 1

Figure 5C:
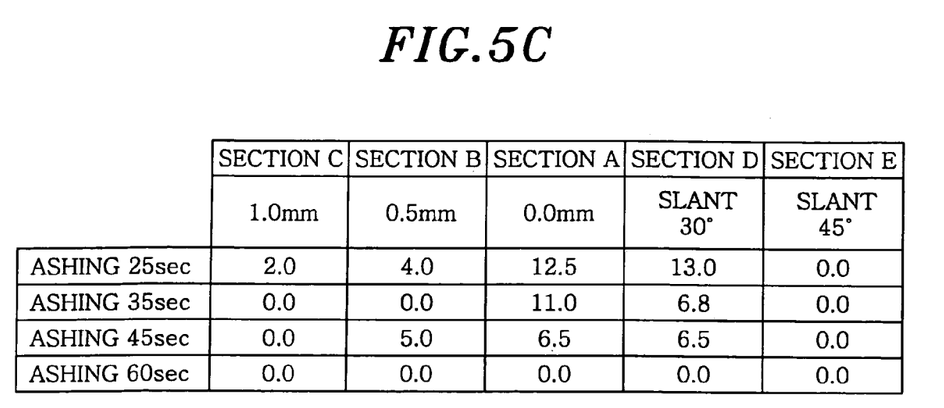

This example is a comparison example where the processing was performed under the same conditions as those in Experimental example 1 except that the supply of the thermally conductive gas and the application of the chuck voltage were not stopped and that the wafer ashing time was set to be 25 seconds, 35 seconds, 45 seconds and 60 seconds. The measured results of the deposits are depicted in FIG. 5C.

Comparative Example 2

Figure 5D:
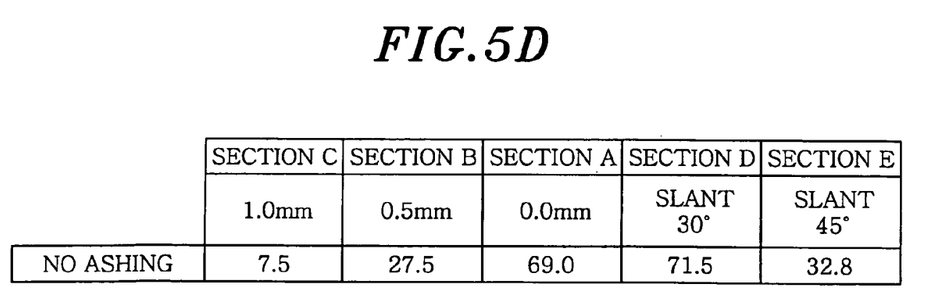

This example is a comparison example where the processing was performed under the same conditions as those in Experimental example 1 except that the wafer ashing was not performed. The measured results of the deposits are shown in FIG. 5D.

Result and Review of Experimental Examples 1, 2 and Comparative Examples 1, 2

As clearly can be seen from the results of FIGS. 5A to 5D, in Comparative example 2 where the wafer ashing process was not performed, the deposits were adhered to SECTIONs A to D. Meanwhile, in Experimental examples 1, 2 and Comparative example 1 where the wafer ashing process was performed, it is noted that deposits were removed by the wafer ashing process in view of the reduced thickness of the deposits. Specifically, in Experimental example 1 where the supply of the thermally conductive gas and the application of the chuck voltage were stopped, the deposits remained after the ashing process for 15 seconds, but no deposits remained after the ashing process for 20 seconds. In Experimental example 2 where only the supply of the thermally conductive gas was stopped, the deposits remained after the ashing process for 25 seconds, but no deposits remained after the ashing process for 35 seconds. Meanwhile, in Comparison example 1 where the supply of the thermally conductive gas and the application of the chuck voltage were not stopped, the deposits were removed only by the ashing process for 60 seconds. From the above results, it has been confirmed that a deposit removal efficiency can be improved by stopping the supply of the thermally conductive gas and further enhanced by stopping both of the supply of the thermally conductive gas and the application of the chuck voltage. Moreover, the enhanced removal efficiency can result in a reduction of the ashing time.

While the invention has been shown and described with respect to the preferred embodiments, it will be understood by those skilled in the art that various changes and modification may be made without departing from the spirit and scope of the invention as defined in the following claims.

What is claimed is:

1. A plasma processing method for performing a plasma processing on a substrate mounted on a mounting table installed in an airtight processing chamber, the mounting table having a smaller size than the substrate, the method comprising the steps of:

mounting the substrate having a surface, on which a resist mask is formed, on the mounting table and then electrostatically adsorbing the substrate on the mounting table by applying a voltage to an electrostatic chuck;

etching the surface of the substrate by using a plasma of an etching gas while cooling the substrate by way of transferring a heat of the substrate to the mounting table through a thermally conductive gas supplied between a top surface of the mounting table and a bottom surface of the substrate;

stopping the supply of the thermally conductive gas; and while the supply of the thermally conductive gas is stopped, ashing the resist mask on the substrate by using a plasma of an ashing gas containing $O_2$.

2. The plasma processing method of claim 1, further comprising a step of: stopping the application of the voltage to the electrostatic chuck after stopping the supply of the thermally conductive gas, wherein the ashing step is performed on the substrate under such conditions.

3. The plasma processing method of claim 1, wherein the etching gas is a compound of carbon and fluorine.

4. The plasma processing method of claim 2, wherein the etching gas is a compound of carbon and fluorine.

5. The plasma processing method of claim 3, wherein in the etching step, an oxygen-containing film on the surface of the substrate is etched.

6. The plasma processing method of claim 4, wherein in the etching step, an oxygen-containing film on the surface of the substrate is etched.

7. The plasma processing method of claim 1, wherein in the etching step, a temperature of the substrate is set within a range from 10° C. to 40° C.

8. The plasma processing method of claim 1, wherein in the ashing step, a temperature of the substrate is set within a range from 60° C. to 78° C.

* * * * *